United States Patent [19]

Yanagisawa et al.

[11] Patent Number: 4,458,291
[45] Date of Patent: Jul. 3, 1984

[54] PACKAGE FOR ENCLOSING SEMICONDUCTOR ELEMENTS

[75] Inventors: Mamoru Yanagisawa; Hidehiko Akasaki, both of Kawasaki; Hideji Aoki, Machda, all of Japan

[73] Assignee: Fujitsu Limited, Kawasaki, Japan

[21] Appl. No.: 400,035

[22] Filed: Jul. 20, 1982

[30] Foreign Application Priority Data

Jul. 22, 1981 [JP] Japan ................. 56-114724

[51] Int. Cl.³ ............................. H05K 7/06
[52] U.S. Cl. ............................ 361/212; 357/84; 174/52 FP; 206/328; 361/220
[58] Field of Search ............... 361/212, 220; 357/84; 174/183, 196, 52 FP; 206/328, 329

[56] References Cited

U.S. PATENT DOCUMENTS 3,345,541 10/1967 Cobaugh et al. ............ 206/328 X
4,084,210 4/1978 Forrest ........................ 361/212
4,327,832 5/1982 de Matteo .................... 206/328

Primary Examiner—E. A. Goldberg
Assistant Examiner—Derek Jennings
Attorney, Agent, or Firm—Staas & Halsey

[57] ABSTRACT

A package for enclosing semiconductor elements having side surfaces at which cross sections of conductive wires for receiving a voltage to effect electric plating are exposed. The side surfaces are provided with a static electricity-preventing device, such recesses formed in the side surfaces, insulating films formed on the side surfaces or removable frames positioned on the side surfaces, so that a high voltage due to static electricity from an exterior source is not applied to the conductive wires.

7 Claims, 13 Drawing Figures

PACKAGE FOR ENCLOSING SEMICONDUCTOR ELEMENTS

BACKGROUND OF THE INVENTION

1. Field of the Invention

The present invention relates to a package for enclosing semiconductor elements; more particularly, it relates to a ceramic package for enclosing a large-scale integrated (LSI) circuit having a number of input/output pins arranged in a matrix fashion, in other words, in a pin grid array, on the rectangular back surface of the package, wherein the side surfaces of the package are treated so as to prevent the LSI circuit from being destroyed due to static electricity.

2. Description of the Prior Art

Generally, packages for enclosing pin grid-type LSI circuits have rectangular front and back surfaces. On the back surface, a number of input/output pins are arranged in a matrix fashion. On the central portion of the front surface, a stage pattern for mounting an LSI chip is formed. On the periphery of the stage pattern on the front surface, an inner pattern is formed to which input/output terminals of the LSI chip are connected through gold wires, respectively. The inner pattern, on the other hand, is connected by tungsten wires to the input/output pins provided on the back surface. On the periphery of the inner pattern, a sealing pattern is formed. The exposed portions of the stage pattern, the inner pattern, and the sealing pattern are electrically plated with gold.

In order to apply a voltage to the stage pattern, the inner pattern, and the sealing pattern, for executing the electrolytic plating of gold, wires for applying the voltage are provided in the package. These wires for applying the voltage are connected at one end to the input/output pins. The other ends of the wires for applying the voltage are exposed on the side surfaces of the package. During electrolytic plating, these exposed ends of the wires are electrically in contact with a conductive layer. After electrolytic plating, the conductive layer is removed. Accordingly, the complete package as a marketable article has side surfaces on which the ends of the wires for applying the voltage are exposed. When a person picks up the complete package with his fingers, the fingers inevitably touch the side surfaces so that a high voltage due to static electricity may often be applied between the exposed ends of the wires for applying the plating voltage, resulting in damage of the LSI chip.

Conventionally, there has been no means provided on the side surfaces for preventing the LSI chip from being destroyed due to static electricity.

SUMMARY OF THE INVENTION

Accordingly, a main object of the present invention is to prevent semiconductor elements enclosed in a package from being destroyed due to static electricity.

Another object of the present invention is to provide a static electricity-preventing means on the side surfaces of a package for enclosing semiconductor elements.

According to the present invention, there is provided a package for enclosing semiconductor elements, comprising conductive wires for receiving a voltage when electrolytic plating is effected in the package, the conductive wires extending in the package to the side surfaces of the package so that the cross sections of the conductive wires are exposed, wherein the side surfaces of the package are provided with a static electricity-preventing means so that a high voltage due to static electricity is not applied to the conductive wires.

According to one aspect of the present invention, the static electricity-preventing means is one in which the conductive wires are so arranged that the cross sections of the conductive wires are exposed at the central portion of each of the side surfaces; and the side surfaces comprise longitudinal projections at the edges of the side surfaces and longitudinal recesses at the central portions.

According to a first embodiment of the invention, each of the longitudinal recesses comprises a U-shaped concave.

According to a second embodiment of the invention, each of the longitudinal recesses comprises a curved surface.

According to a third embodiment of the invention, each of the longitudinal recesses comprises a V-shaped recess.

According to a fourth embodiment of the invention, the static electricity-preventing means comprises an insulating film covering the side surfaces.

According to a fifth embodiment of the invention, the static electricity-preventing means comprises an insulating frame covering the side surfaces.

According to a sixth embodiment of the invention, the static electricity-preventing means comprises a conductive frame covering the side surfaces, the conductive frame electrically contacting the cross sections of said conductive wires and being free to be fitted onto or removed from the side surfaces.

BRIEF DESCRIPTION OF THE DRAWINGS

The above objects and advantages as well as other features of the present invention will be more apparent from the following description of the embodiments when read in conjunction with the accompanying drawings, wherein.

DESCRIPTION OF THE PREFERRED EMBODIMENTS

Now, embodiments of the present invention will be described in detail with reference to the drawings.

Figure 1:
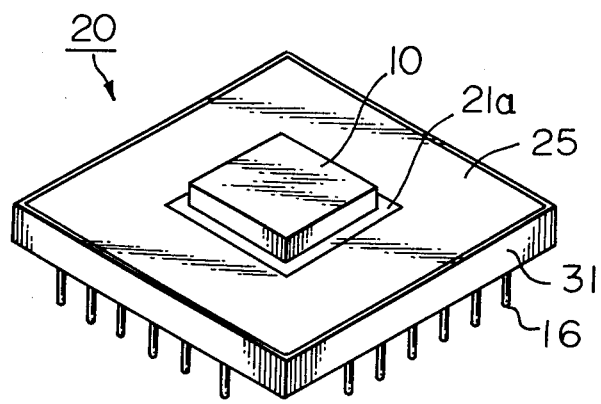
FIG. 1 is a general perspective view illustrating a package enclosing an LSI chip.
Figure 2:
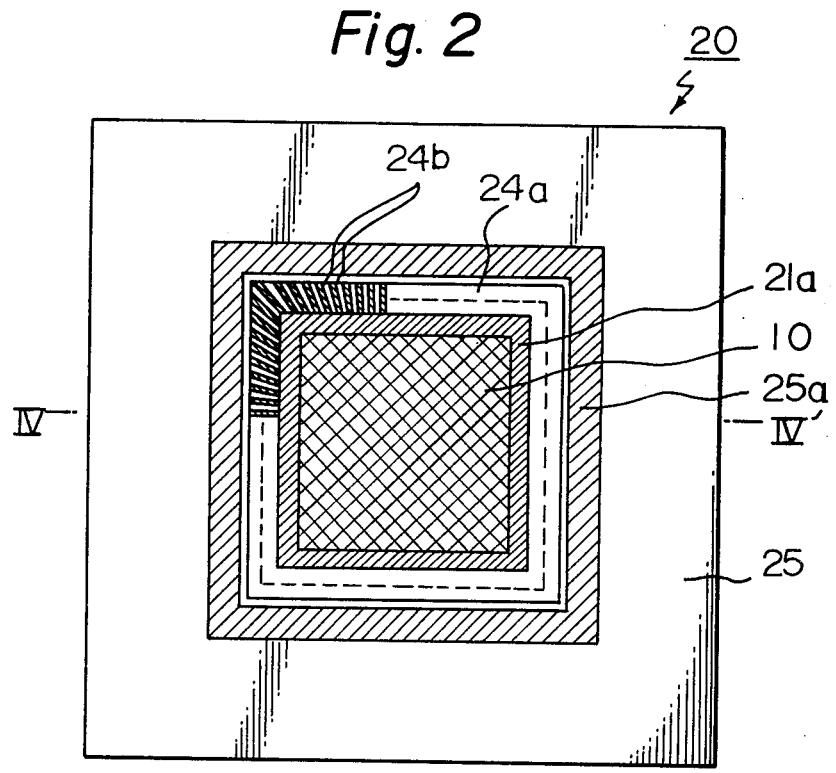
FIG. 2 is a top plan view of the package of FIG. 1.
Figure 3:
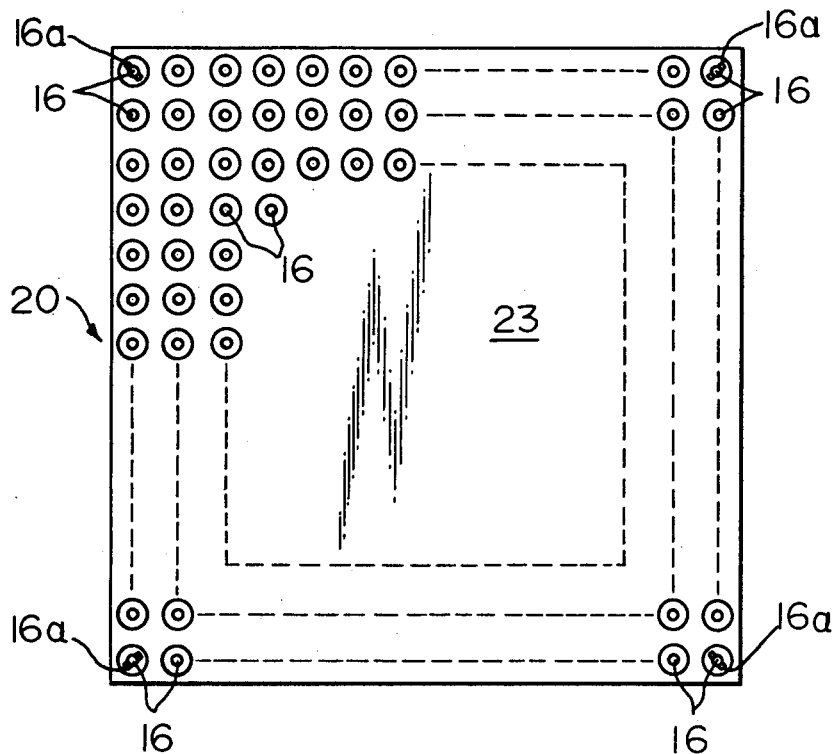
FIG. 3 is a bottom plan view of the package of FIG. 1.
Figure 4:
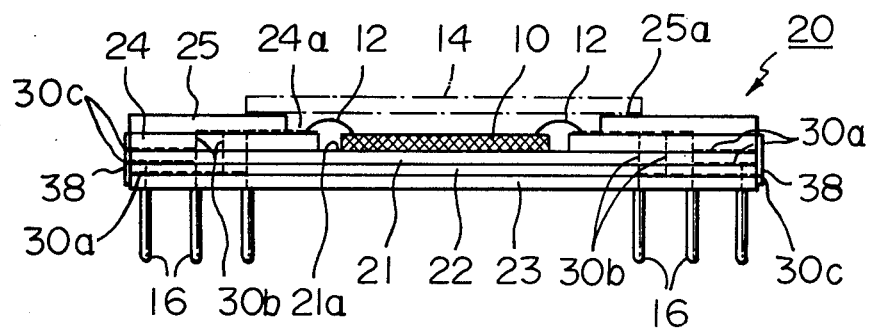
FIG. 4 is a cross-sectional view taken along line IV—IV' of FIG. 2.

FIG. 1 is a general perspective view illustrating a package enclosing an LSI chip. The top plan view of the package of FIG. 1 is illustrated in FIG. 2. The bottom plan view of the package of FIG. 1 is illustrated in FIG. 3. The cross-sectional view taken along line IV—IV' of FIG. 2 is illustrated in FIG. 4. In FIGS. 1 through 4, reference numeral 10 refers to a rectangular LSI chip; 20 refers to a rectangular package which mounts and encloses LSI chip 10; and 16 refers to input/output pins of the package arranged in a pin grid array. The body of the package comprises several ceramic layers which are formed by firing ceramic green sheets. In the illustrated example, five ceramic layers 21 through 25 are provided (see FIG. 4). Each ceramic layer has a rectangular or a square shape and has a thickness of about 0.5 mm. On ceramic layers 21, 22, 23, and 24, necessary electrode wiring patterns 30a are formed by printing the pattern with tungsten paste in accordance with a required circuit design. The green sheets for forming such ceramic layers with wiring patterns 30a are to be stacked, adhered to each other by applying a pressure, and sintered at a high temperature of, for example, 1500° C. through 1600° C. Ceramic layer 24 has a rectangular or a square hole slightly larger than the size of LSI chip 10. On ceramic layer 21 and on the portion exposed to the rectangular hole of ceramic layer 24, stage pattern 21a formed by tungsten paste is provided for mounting LSI chip 10. Uppermost ceramic layer 25 has a rectangular hole larger than the rectangular hole of ceramic layer 24. On ceramic layer 24 and on the portion exposed to the rectangular hole of ceramic layer 25, inner pattern 24a comprised of the tungsten paste layer is provided. On the inner periphery of ceramic layer 25, sealing pattern 25a formed by the tungsten paste is provided. Inner pattern 24a has a number of pattern elements 24b arranged in a radial manner. In FIG. 2, only a part of the pattern elements are illustrated for the purpose of simplicity. The number of pattern elements 24b is the same as the number of input/output terminals; in other words, the number is the same as the number of bonding pads of LSI chip 10. Through the sintering process for firing the stacked green sheets into a ceramic body, the printed tungsten paste layers are converted into fired conductive layers. Thereafter, the exposed portion of the fired conductive layers is plated with gold. LSI chip 10 is mounted on the gold-plated stage pattern 21a. Each gold-plated pattern element and each corresponding bonding pad of LSI chip 10 are connected by gold wire 12. After LSI chip 10 is mounted on stage pattern 21a and after wire bonding is effected in inner pattern 24a, cap 14 is mounted on sealing pattern 25a so as to encapsulate the cavity where LSI chip 10 is provided.

Input/output pins 16 are fixed to lowermost ceramic layer 23 after the sintering process but usually before the chip mounting and wire bonding process. Input/output pins 16 are arranged in a matrix fashion on the back surface of package 20 as illustrated in FIG. 3. In accordance with the necessary number of input/output pins, input/output pins 16 are provided from the periphery to the central portion of the back surface of ceramic layer 23. Therefore, if the required number of input/output pins is small, there may be an input/output pins on the central portion of the back surface of ceramic layer 23. The number of input/output pins 16 is larger than the number of pattern elements 24b of inner pattern 24a. Input/output pins 16 are electrically connected to pattern elements 24b of inner pattern 24a by wiring patterns 30a and conductive wires 30b, respectively. Conductive wires 30b illustrated by the dashed lines in FIG. 4 are provided in through holes which penetrate through each ceramic layer. As illustrated in FIG. 3, four input/output pins 16 provided on the four corners of package 20 each have projection 16a, respectively. These projections 16a function as stopper means when the package is inserted into a printed wiring board.

Wiring patterns 30a on each ceramic layer functions as a lead for applying a voltage for effecting the electrolytic plating of gold on stage pattern 21a, on the exposed portion of inner pattern 24a, and on sealing pattern 25a as well as leads for connecting input/output pins 16 and pattern elements 24b of inner pattern 24a, respectively. More precisely, stage pattern 21a must have a gold surface so as to enable LSI chip 10 to be fixed to stage pattern 21a by welding. Also, pattern elements 24b of inner pattern 24a must have gold surfaces so as to enable gold wires 12 to be connected to pattern elements 24b by bonding technology. Further, sealing pattern 25a must have a gold surface so as to enable cap 14 to be fixed to sealing pattern 25a by welding. On the other hand, electrode wiring patterns 30a and wires 30b cannot be made of gold since the temperature for effecting sintering of the ceramic green sheets is so high that the gold would melt. Therefore, electrode wiring patterns 30a and wires 30b are formed of tungsten paste. Wiring patterns 30a and wires 30b are stacked, and adhering ceramic green sheets are sintered so as to form ceramic layers 21 through 25. Then gold plating is effected on the necessary portions.

Figure 5:
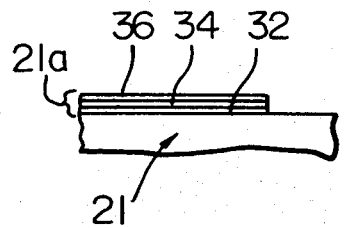
FIG. 5 is an exploded view of a part of the package of FIG. 4.

FIG. 5 is a partial exploded view of stage pattern 21a. In the figure, stage pattern 21a is formed on ceramic layer 21. Stage pattern 21a comprises tungsten paste fired layer 32 formed on ceramic layer 21, nickel layer 34 formed on tungsten paste fired layer 32 by electrolytic plating, and gold layer 36 formed on nickel layer 34 by electrolytic plating.

Inner pattern 24a and sealing pattern 25a have layers which are the same as layers 32, 34, and 36 illustrated in FIG. 5.

Figure 6:
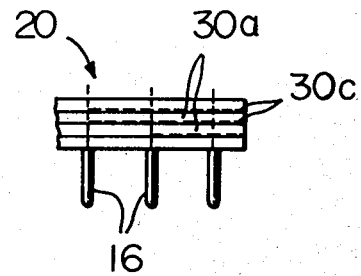
FIG. 6 is a partial of a cross-sectional view of a conventional package illustrating a side surface.

Referring to FIGS. 4 and 6, in order to effect the electrolytic plating of gold, a voltage must be applied to stage pattern 21a, to inner pattern 24a, and to sealing pattern 25a. This voltage is applied through wiring patterns 30a. For the purpose of applying the voltage, cross sections, or ends, 30c of the wires of wiring patterns 30a are extended to and exposed at the side surfaces of ceramic layers 21 through 25. For the electrolytic plating of gold, conductive layers 38 which are usually formed by the fired tungsten paste layer are provided to cover the side surfaces of the ceramic layers so that ends 30c of wiring patterns 30a are electrically in contact with conductive layers 38. Electrolytic plating is effected by applying a voltage to conductive layers 38, which are electrically connected through wiring patterns 30a to stage pattern 21a, to inner pattern 24a, and to sealing pattern 25a. After the completion of electrolytic plating, conductive layers 38, which cause all of input/output pins 16 to be short circuited, are unnecessary and are, therefore, removed by abrasion. As a result, cross sections 30c of wiring patterns 30a are again exposed at the side surfaces of the package.

As mentioned above, conductive layers 38 are removed after electrolytic plating and then LSI chip 10 is mounted and the package is a complete, marketable package. When workers mount the LSI chip on the package, connect the LSI chip and inner pattern 24a with wires, or when mount cap 14 is mounted on sealing plate 25a so as to complete the package as a semiconductor device, they inevitably pick up the package to move it to a desired place. At that time, most workers pick up the package with their fingers so as to press the side surfaces to which cross sections 30c of wiring patterns 30a are exposed. As is well known, a human body is electrified by static electricity. Therefore, when a person touches the side surface of package 20 after LSI chip 10 has been mounted and after wire bonding has been effected, LSI chip 10 may often be destroyed by a high voltage due to static electricity.

Conventionally, there has been no means at the side surfaces for preventing the LSI chip from being destroyed due to static electricity. FIG. 6 is a part of a cross-sectional view of a conventional package illustrating a side surface. In the figure, the side surface, to which cross sections 30c of wiring patterns 30a are exposed, is a flat plane. Therefore, a person's fingers can easily touch cross sections 30c.

Figure 7:
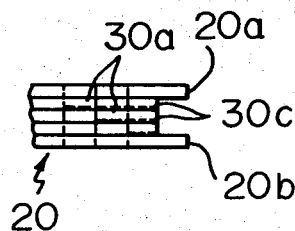
FIG. 7 is a partial of a cross-sectional view of a package illustrating a first embodiment of the present invention.
Figure 8:
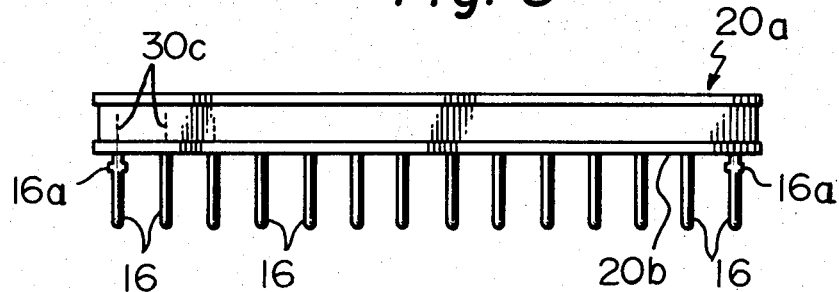
FIG. 8 is a side view of the package shown in partial cross section in FIG. 7.

FIG. 7 is a part of a cross-sectional view of a package, illustrating a first embodiment of the present invention. FIG. 8 is a side view of the package shown partially in cross section in FIG. 7. In FIGS. 7 and 8, cross sections 30c of wiring patterns 30a are exposed to the side surfaces. The side surface has two longitudinal projections 20a and 20b at the edges thereof. Between projections 20a and 20b, a U-shaped concave is formed. Cross sections 30c of the wiring patterns 30a are arranged at the center portion of the side surface so as to be exposed in the U-shaped concave of the side surface and are not exposed at projections 20a or 20b of the side surface. The U-shaped concave is formed by further abrasing the central portion of the side surface after removing conductive layers 38. The depth of the U-shaped concave is less than several millimeters so that a person's fingers do not touch exposed cross sections 30c of wiring patterns 30a. The other side of the side surface also has the same structure as illustrated in FIGS. 7 and 8.

Figure 9:
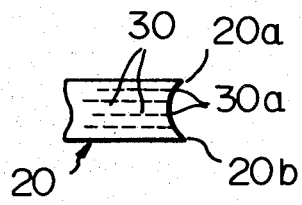
FIGS. 9 and 10 are partial cross-sectional side views of packages according to second and third embodiments of the present invention, respectively.
Figure 10:
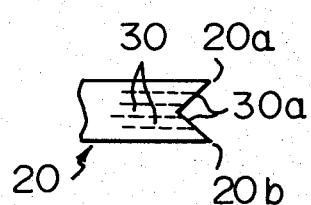

FIGS. 9 and 10 are partial cross-sectional side views of packages according to second and third embodiments, respectively. In FIG. 9, instead of the U-shaped concave of the package of FIG. 7, a recess having a curved surface is employed. This recess can also be formed by abrasing the central portion of the side surface after removing conductive layers 38. In FIG. 10, a V-shaped recess is employed in place of the U-shaped concave of FIG. 7. This V-shaped recess can also be formed in a manner similar to the U-shaped concave of FIG. 7 or the curved recess of FIG. 9.

Figure 11:
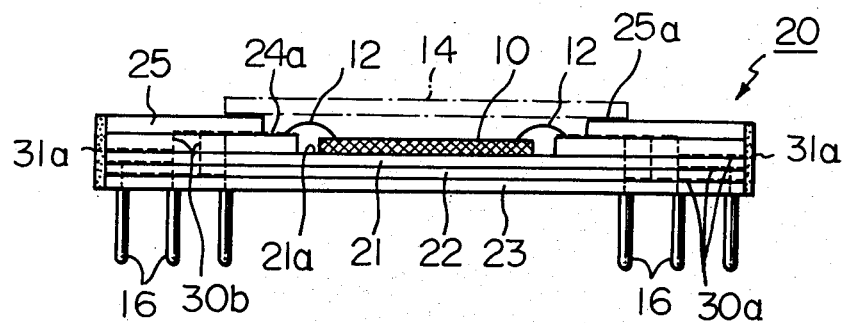
FIGS. 11 through 13 are cross-sectional views illustrating packages according to fourth, fifth, and sixth embodiments of the present invention.
Figure 12:
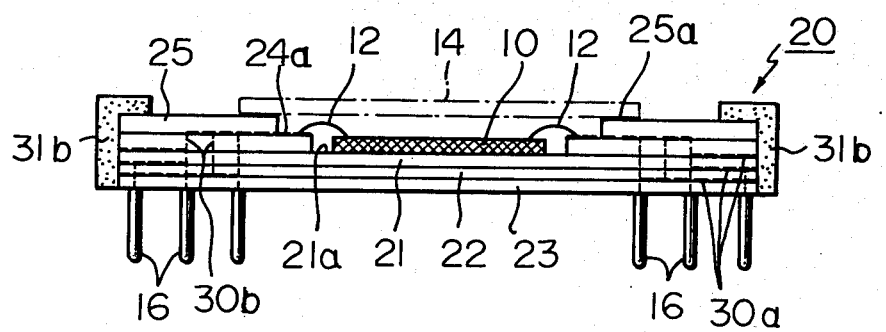
Figure 13:
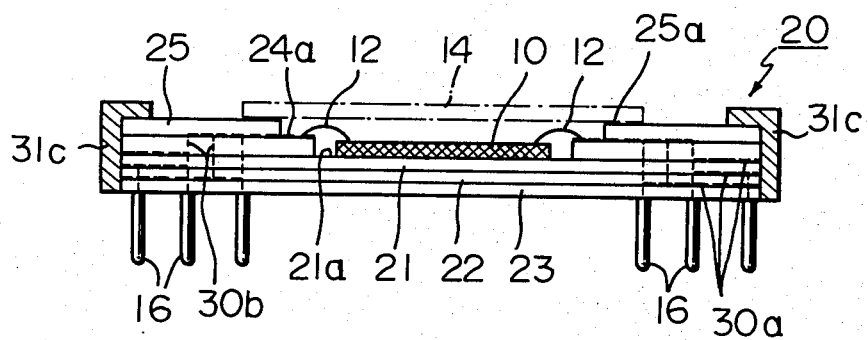

FIGS. 11 through 13 are cross-sectional views illustrating packages according to fourth, fifth, and sixth embodiments of the present invention, respectively. In FIG. 11, insulating films 31a are formed on the side surfaces of the package. In FIG. 12, insulating frames 31b are provided to cover the side surfaces of the package. In FIG. 13, conductive frames 31c are provided to cover the side surfaces of the package so that cross sections 30c are electrically in contact with conductive frames 31c. Conductive frames 31c are free to be fitted onto or removed from the side surfaces and are, of course, removed after the LSI chip is mounted and after wire bonding is completed.

From the foregoing description, it will be apparent that, according to the present invention, by providing simple means such as recesses, insulating films, or conductive frames which are free to be fitted onto or removed from the side surfaces of the package, the LSI chip is prevented from being destroyed during handling of the package.

We claim:

1. A package for enclosing semiconductor elements and for connection to terminals of an external circuit, comprising: a plurality of substrate layers having a recess portion formed therein for mounting the semiconductor elements; conductive wires formed in said substrate layers, having inner patterns exposed in said recess portion, and extending in said package from said inner patterns to the side surfaces of said package so that the cross sections of said conductive wires are exposed for receiving a voltage when electrolytic plating is effected to said inner patterns; a plurality of pins provided on the bottom surface of the package for connection to corresponding terminals of the external circuit, said pins being electrically connected to the semiconductor elements through said conductive wires in said package; and static electricity-preventing means provided at said side surfaces of said package as an integral part of said package for preventing a high voltage due to static electricity from being applied to said cross-sections of said conductive wires after the electrolytic plating is effected.

2. A package as set forth in claim 1, wherein said conductive wires are so arranged that the cross sections of said conductive wires are exposed at the central portion of each of said side surfaces; and wherein said static electricity-preventing means comprises longitudinal projections at the edges of said side surfaces and longitudinal recesses at the central portions of said side surfaces.

3. A package as set forth in claim 2, wherein each of said longitudinal recesses comprises a U-shaped concave.

4. A package as set forth in claim 2, wherein each of said longitudinal recesses comprises a curved surface.

5. A package as set forth in claim 2, wherein each of said longitudinal recesses comprises a V-shaped recess.

6. A package as set forth in claim 1, wherein said static electricity-preventing means comprises an insulating film covering said side surfaces.

7. A package as set forth in claim 1, wherein said static electricity-preventing means comprises an insulating frame covering said side surfaces.

* * * * *

UNITED STATES PATENT AND TRADEMARK OFFICE
CERTIFICATE OF CORRECTION

PATENT NO. : 4,458,291

DATED : Jul. 3, 1984

INVENTOR(S) : Yanagisawa et al.

It is certified that error appears in the above-identified patent and that said Letters Patent is hereby corrected as shown below:

Column 1, line 68, after "exposed," insert --and--.
Column 5, line 21, "a part of a" should be --a partial--.

Signed and Sealed this

Second Day of April 1985

[SEAL]

Attest:

DONALD J. QUIGG

Attesting Officer

Acting Commissioner of Patents and Trademarks